(12) United States Patent
Elias et al.

(10) Patent No.: US 10,241,556 B2
(45) Date of Patent: Mar. 26, 2019

(54) AUTONOMOUSLY CONTROLLING A BUFFER OF A PROCESSOR

(71) Applicant: Intel Corporation, Santa Clara, CA (US)

(72) Inventors: Vinu K. Elias, Austin, TX (US); Sundar Ramani, Bangalore (IN); Arvind S. Tomar, San Jose, CA (US); Jianjun Liu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 15/025,575

(22) PCT Filed: Nov. 27, 2013

(86) PCT No.: PCT/CN2013/087934
§ 371 (c)(1),
(2) Date: Mar. 29, 2016

(87) PCT Pub. No.: WO2015/077936
PCT Pub. Date: Jun. 4, 2015

(65) Prior Publication Data
US 2016/0246352 A1 Aug. 25, 2016

(51) Int. Cl.
*G06F 1/32* (2006.01)
*G06F 1/3212* (2019.01)
(Continued)

(52) U.S. Cl.
CPC .......... *G06F 1/3212* (2013.01); *G06F 1/3234* (2013.01); *H03K 19/018585* (2013.01);
(Continued)

(58) Field of Classification Search
CPC ..... G06F 1/32; G06F 1/28; G06F 1/00; G06F 1/26
(Continued)

(56) References Cited

U.S. PATENT DOCUMENTS 5,500,611 A * 3/1996 Popat ............. H03K 19/018585
326/57
6,020,757 A 2/2000 Jenkins
(Continued)

FOREIGN PATENT DOCUMENTS

CN 1908575 2/2007
JP H11-136119 5/1999
(Continued)

OTHER PUBLICATIONS

Japan Intellectual Property Patent Office, Office Action dated May 26, 2017 in Japanese Patent Application No. 2016-519997.
(Continued)

*Primary Examiner* — Jaweed A Abbaszadeh
*Assistant Examiner* — Keshab R Pandey
(74) *Attorney, Agent, or Firm* — Trop, Pruner & Hu, P.C.

(57) ABSTRACT

In an embodiment, an apparatus includes an input/output (I/O) buffer to couple a logic unit to another device coupled via a pad, and a logic coupled to the I/O buffer to detect a value on the pad and to control the I/O buffer to provide the value to the pad, responsive to entry into an architectural state. Other embodiments are described and claimed.

19 Claims, 8 Drawing Sheets

(51) Int. Cl.
*H03K 19/0185* (2006.01)
*G06F 1/3234* (2019.01)
*G11C 7/10* (2006.01)

(52) U.S. Cl.
CPC ... *H03K 19/018592* (2013.01); *G11C 7/1057* (2013.01); *G11C 7/1084* (2013.01); *G11C 2207/105* (2013.01)

(58) Field of Classification Search
USPC ....... 713/300, 310, 320, 321, 322, 323, 324, 713/345, 375
See application file for complete search history.

(56) References Cited

U.S. PATENT DOCUMENTS

| | | | |
|---|---|---|---|
| 6,496,058 B1 | 12/2002 | Hong | |
| 6,794,893 B2 | 9/2004 | Lin et al. | |
| 7,969,181 B1* | 6/2011 | Fefer | H03K 19/0005 326/30 |
| 8,200,954 B2* | 6/2012 | Murawski | G06F 9/441 327/365 |
| 8,341,300 B1* | 12/2012 | Karamcheti | G06F 13/1642 710/5 |
| 8,564,335 B1* | 10/2013 | Weiser | H03K 19/0016 326/58 |
| 2003/0160651 A1 | 8/2003 | Lin et al. | |
| 2006/0267632 A1* | 11/2006 | Schwarz | H03K 19/01759 326/82 |
| 2007/0030017 A1 | 2/2007 | Choi et al. | |
| 2008/0077779 A1* | 3/2008 | Zohar | G06F 9/30167 712/226 |
| 2013/0042129 A1* | 2/2013 | Park | G06F 1/3275 713/323 |

FOREIGN PATENT DOCUMENTS

| | | |
|---|---|---|
| JP | 2004537792 | 12/2004 |
| WO | 9811667 | 3/1998 |
| WO | 2003009117 | 1/2003 |

OTHER PUBLICATIONS

European Patent Office, Supplementary European Search Report dated May 22, 2017 in European Patent Application No. 13898241.8.

Korea Intellectual Property Office, Office Action dated Feb. 15, 2017, in Korean Patent Application No. 10-2016-7010673.

International Searching Authority, "Notification of Transmittal of the International Search Report and the Written Opinion of the International Searching Authority," dated Aug. 22, 2014, in International application No. PCT/CN2013/087934.

Korean Intellectual Property Office, Notice of Preliminary Rejection dated Aug. 17, 2017, in Korean Patent Application No. 10-2016-7010673.

State Intellectual Property Office, First Office Action dated Apr. 4, 2018 in Chinese Patent Application 201380080545.1, seven pages.

Japan Patent Office, Notification of Reasons for Refusal dated Jan. 17, 2018 in Japanese Patent Application No. 2016-519997.

* cited by examiner

AUTONOMOUSLY CONTROLLING A BUFFER OF A PROCESSOR

BACKGROUND

Modern integrated circuits (ICs) couple to other devices of a platform via pins or pads that interface the IC via connection to interconnects routed on one or more circuit boards. Electrical input/output (I/O) pad contention is an undesirable I/O pad state in which more than one device coupled to the pad attempts to place opposite values on pad at the same time. I/O pad contention leads to erroneous operation, damage to hardware and a direct current (DC) short circuit path from a supply voltage to ground, resulting in a significant increase in standby leakage current, which is especially undesirable in portable devices that operate on battery power.

DETAILED DESCRIPTION

Figure 1:
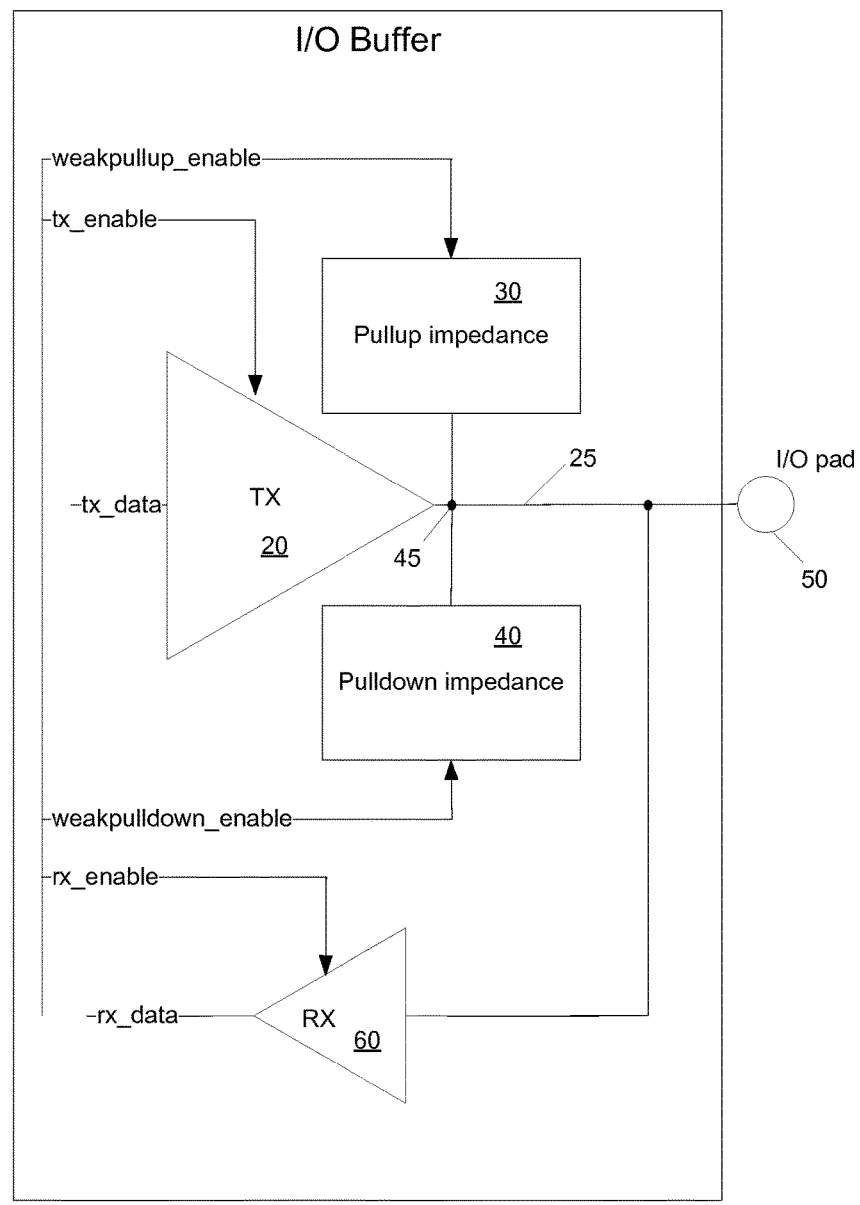
FIG. 1 is a block diagram of an input/output (I/O) buffer in accordance with an embodiment of the present invention.

In many cases, general purpose input/output (GPIO) bi-directional pads of an IC such as a processor or system on chip (SoC) can be configured (direction—input or output, pad state—high or low) to be used as interfaces to camera, modem, storage and audio devices, among other peripheral devices of a platform. In general, GPIO pad configuration (state, direction and strength) are programmed using values stored in one or more control registers. These registers have hardware default values that can be overwritten during certain architectural states (e.g., reset_deassertion, standby assertion and powergood_assertion) using software/firmware flows.

Typically SoC firmware code or a software-based I/O device driver will configure the I/O pad direction, buffer strength and standby state depending on its specific use case. However, existing GPIO programming flow is time consuming and error prone since it is done entirely manually. Such programming starts with a board/platform team deciding product configurations and choosing devices of different vendors to be connected to the I/O pads. The SoC software team will then collaborate with platform teams to decode the configuration and hand code control register values into a firmware image programmed into the SoC. An incorrectly programmed I/O pad during SoC standby can lead to electrical pad contention, which increases leakage current and drains battery life. Such incorrect programming can also cause difficult to debug functional failure cases during SoC power-on, even with simple I/O configuration changes.

Embodiments detect and correctly configure I/O pad state based on a current architectural state. As a result, tedious manual debug, power and functionality correlation on a final hardware design can be avoided. More specifically, a GPIO pad value and direction can be autonomously controlled and generated during at least certain architectural states such as standby state. The technique is adaptive to the I/O pad use case on the platform and only drives the architecturally and electrically correct I/O pad states. A technique in accordance with an embodiment can be implemented in hardware using a finite state machine (FSM) and integrated into an I/O controller. Automation and hardware control enables the sample and drive scheme to be adaptive, correct and achieve a fast turnaround time. By avoiding electrical pad contention, unnecessary leakage current is eliminated. Using an embodiment of the present invention, a controller can intelligently adapt or fix up configurations of I/O pads.

A bi-directional GPIO pad can have multiple drivers. In the context of a SoC, the pad can be driven by the SoC side or on-board endpoint devices. If an I/O pad is driven high, the SoC should not try to place a low on the pad, e.g., via use of a pulldown device and vice-versa. Embodiments operate to sample an I/O pad voltage prior to driving a state onto the pad using one or more weakpull impedance devices, in a manner to ensure that there is no pad electrical contention.

In this way, the need for intensive manual involvement for programming GPIO pads is avoided. As briefly described above, in general this manual programming includes collaboration between board/platform engineering teams and software engineering teams. Once a desired pad value is captured by manually checking a data sheet and interface electrical specifications, it is programmed into the SoC. Several teams collaborate and iterate through steps several times until a power-optimized and functionally stable setting is achieved. This process is very time consuming, and is repeated when a different device vendor is selected or board configuration changes even slightly. Embodiments instead adapt to the stable I/O pad state irrespective of board configuration or device choice. The I/O voltage is sampled before the SoC enters any architectural state, e.g., system standby state, reset de-assertion, etc., and an appropriate value is driven to the pad.

Referring now to FIG. 1, shown is a block diagram of an input/output (I/O) buffer in accordance with an embodiment of the present invention. As shown in FIG. 1, buffer 10 is a general purpose I/O buffer (GPIO). GPIO buffer 10 has an analog front-end (AFE) custom circuit block that can be controlled by digital signals. Although embodiments described herein are with relation to general purpose I/O buffers, understand the scope of the present invention is not limited in this regard and the control mechanisms described herein apply equally to other types of buffers. In general, buffer 10 couples signal information between one or more logic units of an IC of which the buffer is a part and one or more other devices that couple to the IC via some type of interconnect. For purposes of discussion, assume that I/O buffer 10 is part of a processor such as a multicore processor, SoC or other type of processor device. In turn, assume that the processor couples to another IC or other device of a system via an interconnect, e.g., routed on a circuit board of the system.

In a transmit direction, information to be communicated via I/O buffer 10 is received as transmit data (tx_data) in a transmitter 20, which conditions the signal and outputs it via an I/O pad 50, which may be any type of I/O pin, surface mount pad or any other type of conductive element of the processor to couple to an interconnect. To enable transmit communications, a transmit enable signal (tx_enable) is coupled to transmitter 20 to enable the transmitter to drive a strong logic high or low value on pad 50. As further seen, to enable certain states to be present on an I/O line 25 that couples transmitter 20 to pad 50, a pullup impedance 30 and a pulldown impedance 40 further couple to line 25 at a node 45 coupled to an output coupled to transmitter 20. These impedance devices, which in an embodiment may be implemented using weakpull resistors, e.g., having a value between approximately 2 and 50 kilo ohms, are controlled via control signals (respectively weakpullup_enable and weakpulldown_enable), to respectively pull pad 50 to a logic high or low value. To this end, pullup impedance 30 may be switchably coupled (e.g., via a metal oxide semiconductor field effect transistor (MOSFET) or other type of switch) between a supply voltage node (not shown) and the output node when enabled. And, pulldown impedance 40 may be switchably coupled (e.g., via a MOSFET or other type of switch) between a reference voltage node (typically ground) and the output node when enabled.

As further seen in FIG. 1, I/O buffer 10 enables receipt of incoming signal information from another component of a system via pad 50. More specifically, the incoming information couples through a receiver 60 that provides the incoming signal information in the form of received data (rx_data) to a given one or more logic units of the processor. Receiver 60 is enabled by another control signal (rx_enable), to enable the receiver to provide an input path from pad 50. Although shown at this high level in the embodiment of FIG. 1, understand the scope of the present invention is not limited in this regard, and variations of the buffer are possible.

Figure 2:
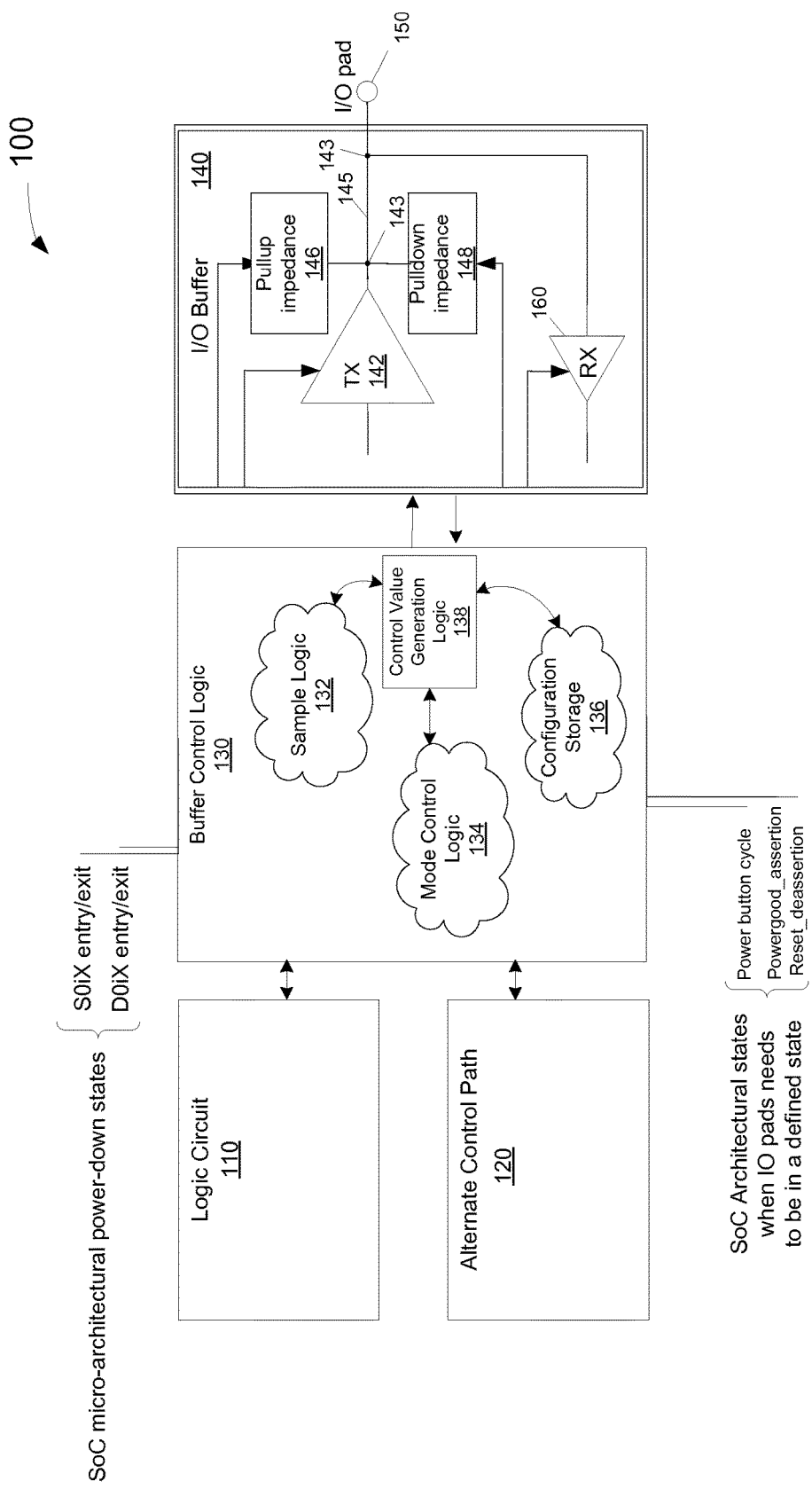
FIG. 2 is a block diagram of a control logic implementation in accordance with an embodiment of the present invention.

Referring now to FIG. 2, shown is a block diagram of a control logic implementation in accordance with an embodiment of the present invention. As shown in FIG. 2, circuit 100 is part of a processor such as a portion of an I/O controller that couples the processor to one or more other devices within a system. In general, for a functional mode of operation, a logic circuit 110 which may be any type of logic unit of the processor (such as a core, fixed function unit or other generator or consumer of I/O signals) is present. In many cases, circuit 110 seeks to output or receive information during a normal functional mode of operation. Accordingly, the signals communicate between logic circuit 110 and a buffer control logic 130 coupled between circuit 110 and a I/O buffer 140, which in the embodiment of FIG. 2 is a GPIO buffer. In general, logic 130 and buffer 140 may be part of an I/O controller of the processor, which may be part of an uncore portion of the processor.

As will be described further herein, buffer control logic 130 may operate in various modes of operation to provide a signal communication path between logic circuit 110 and another device coupled to the processor via an I/O pad 150. In other modes of operation, e.g., a given architectural or micro-architectural state such as power on, reset, and standby/suspend states, buffer control logic 130 may control buffer 140 to have a certain value on an I/O line 145 based on one of various sources of information, depending on the mode of operation. Embodiments thus automate a process of determining the I/O pad configuration when the SoC enters into a given architectural or micro-architectural state and avoid electrical pad contention, to achieve the lowest possible I/O leakage current.

In some instances in a standby or suspend mode, a software or firmware-controlled value may be provided via an alternate control path 120. In other cases for certain architectural states, a sampling-based approach may be used such that buffer control logic 130 determines a value at I/O pad 150 and controls I/O buffer 140 to generate a signal to replicate that value so that electrical contention does not occur.

As further seen in FIG. 2, buffer control logic 130, which may be hardware, firmware and/or software or combinations thereof, is formed of various constituent logics. These logics include a sample logic 132 that is configured to sample the state of pad 150 (and/or the state on signal line 145). Buffer control logic 130 further includes a mode control logic 134 that determines a given mode in which the processor is operating and provides such information to a control value generation logic 138 that determines appropriate control values for one or more control inputs to buffer 140 to enable an appropriate value to be provided at pad 150. As further shown, a configuration storage 136 also may be included in the buffer control logic 130. As will be described herein, such configuration storage may include multiple fields each to store control information for one or more controllable values for buffer 140.

As to buffer 140, it is configured similarly to buffer 10 of FIG. 1. Accordingly shown is a transmitter 142 having a pullup impedance 146 and a pulldown impedance 148 coupled to an output node 143 on signal line 145 that in turn couples to IO pad 150.

As further illustrated in FIG. 2, buffer control logic 130 may further receive various architectural and micro-architectural state information signals. In the embodiment shown the architectural states including a power good assertion state, a reset deassertion state, and a power button cycle state. In an example embodiment, buffer control logic 130 may cause particular values to be provided to pad 150 in these states. Of course additional architectural states may also be present and may cause certain other values to be provided to pad 150. Furthermore, certain micro-architectural power states may occur during operation, and information regarding these states also may be provided to buffer control logic 130. In turn, this information also may cause buffer control logic 130 to present appropriate values at pad 150. Understand that although shown with this particular implementation in the embodiment of FIG. 2, the scope of the present invention is not limited in this regard. For example, the circuitry of FIG. 1 is with regard to a single I/O buffer. Similar circuitry may be provided for each such buffer, or a centralized control logic with corresponding control registers may be provided to accommodate all buffers.

The sample and drive scheme may be used during a standby mode to configure I/O pad 150. In a functional mode and other architectural states, logic 130 provides the flexibility to use a software/firmware-driven approach or legacy approach, e.g., using an override or bypass control bit. In an embodiment, logic 130 may disable the weakpull (up/down) impedances from the pad during active mode, to help both to reduce active current and improve signal integrity. Such control can be realized, as logic 130 can re-enable the devices with very low latency at architectural state changes in which the devices are to be used.

Figure 3:
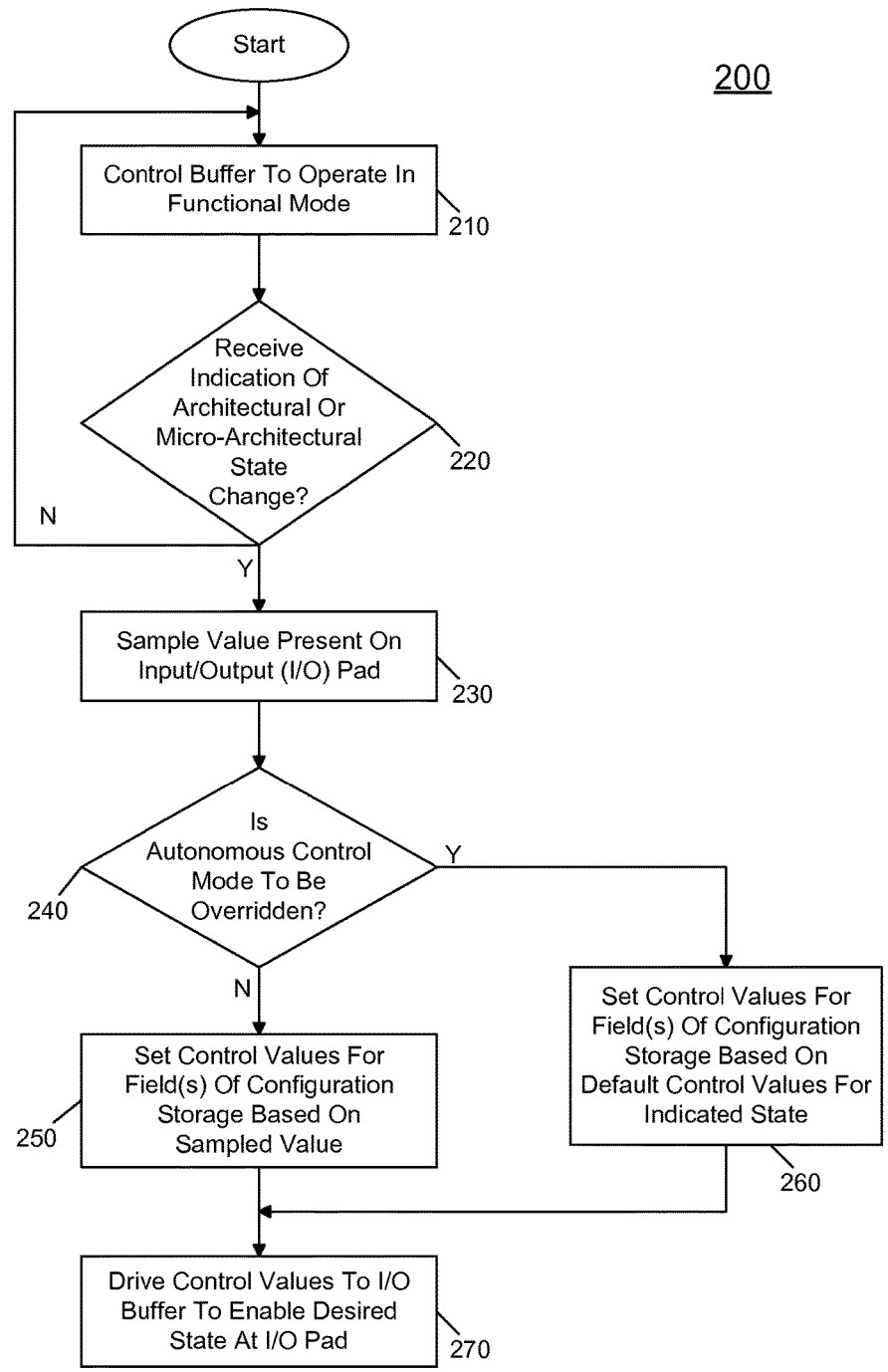
FIG. 3 is a flow diagram of a method for controlling a buffer in accordance with an embodiment of the present invention.

Referring now to FIG. 3, shown is a flow diagram of a method for controlling a buffer in accordance with an embodiment of the present invention. As shown in FIG. 3, method 200 may be implemented at least in part using buffer control logic associated with the buffer. Assume for purposes of the discussion of method 200 that a device (such as a processor or SoC) is operating in a normal functional mode such that the buffer is actively communicating with another device either in a transmit direction only, a receive direction only, or in a combined transmit/receive direction (block 210). For a transmit mode of operation, outgoing signal information is received from a given logic unit of the device to couple through the I/O buffer. Similarly for a receive mode of operation, incoming signal information provided through the I/O buffer to a given logic unit of the device. Thus in this normal operation mode, the buffer control logic generally operates to allow signal information as received from a logic unit to pass through the I/O buffer and vice versa. Note that the weakpull devices can be disabled during functional mode when entering an active mode with a lowest possible latency, avoiding contention and signal integrity issues.

Next it is determined whether an indication of a change in state has been received (diamond 220). Such change in state may correspond to one or more of an architectural or micro-architectural state change. In general, an architectural state change corresponds to a change in state of an entire device that is visible to the system as a whole, while in turn a micro-architectural state change may be a change that is relevant only to a part of a device such as a power state change for a given core or other portion of a device. As such, in a micro-architectural state each pad or clusters of pad states can be different depending on the state of the controller. Note that a global architectural state visible to the entire system can override a micro-architectural pad state value, using the logic described herein.

If no such indication is received, normal operation continues at block 210. Otherwise, if it is determined that a state change occurs, control passes to block 230 where a value present on the corresponding I/O pad is sampled. In an embodiment, the value may be sampled via a receiver of the I/O buffer. Using the control logic described herein, pad states can be flexibly sampled at specific architectural states, or periodically sampled.

Next it is determined whether an autonomous control mode is to be overridden (diamond 240). Such autonomous control mode may be performed in situations where the buffer control logic automatically determines an appropriate value to be driven to the I/O pad. If this mode is to be overridden, control passes to block 260 where one or more control values for fields of a configuration storage may be set based on certain default control values for the indicated state. That is, when the autonomous mode is overridden, software and/or firmware-controlled values may be provided to the configuration storage. Note that this configuration storage includes one or more fields to store control values that in turn are used to control the I/O buffer. Otherwise if the autonomous control mode is determined not to be overridden, control passes to block 250, where one or more control values for the configuration storage fields may be set based on the sampled value.

In either case, control next passes to block 270, where control values obtained from the configuration storage may be driven to the I/O buffer. By driving of these control signals to the I/O buffer, a desired value at the I/O pad may be obtained. More specifically in embodiments this desired value may correspond to a sampled value at this pad. In this way, electrical contention and/or an undesired leakage path is avoided, enabling reduced power consumption, e.g., in a standby or other low power mode. Although shown at this high level in the embodiment of FIG. 3, understand that the scope of the present invention is not limited in this regard. Note that the method of 200 may independently be performed for each buffer to be controlled as described herein.

Figure 4:
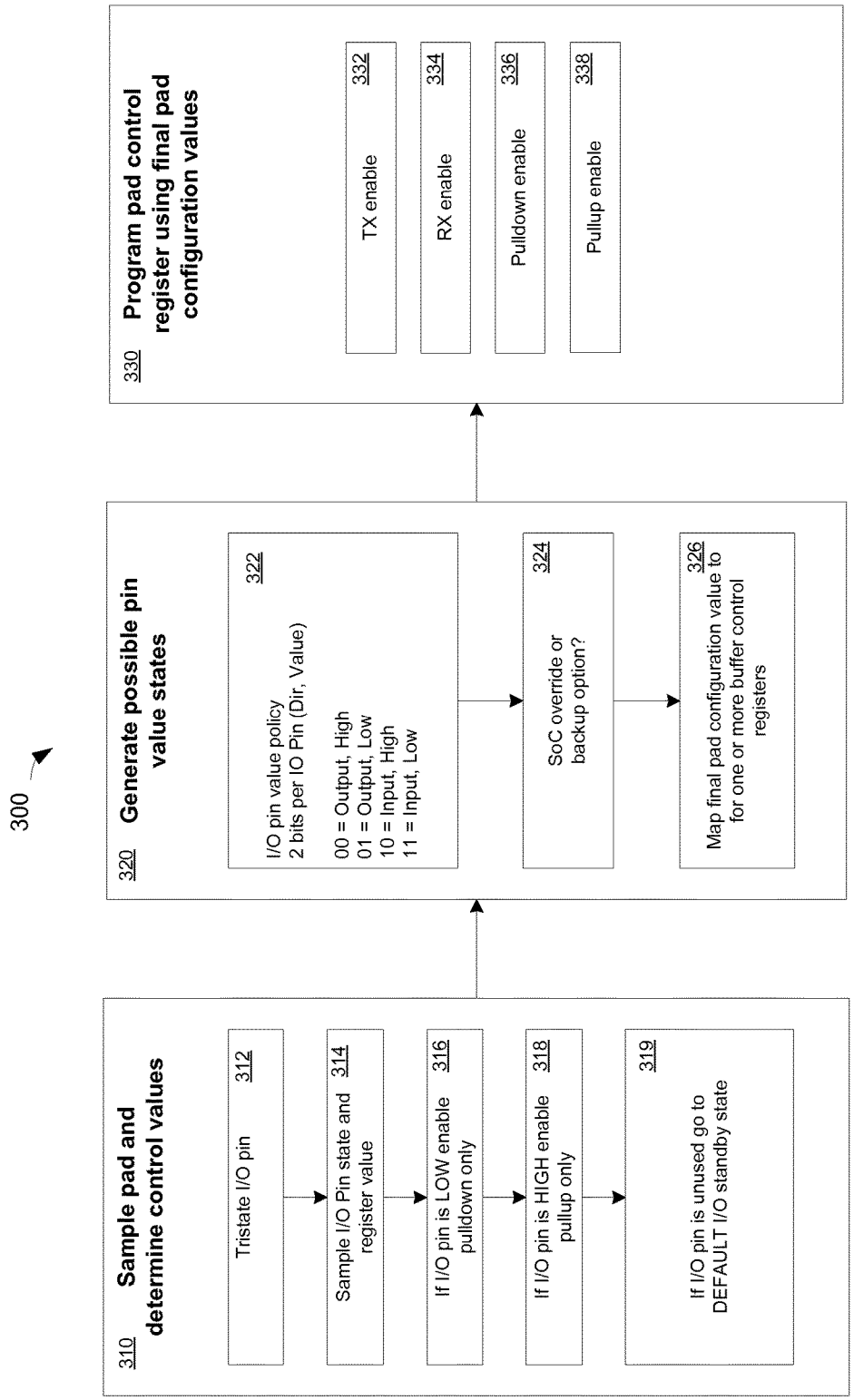
FIG. 4 is a block diagram detailing operations performed in sampling, generating and programming one or more controllable elements of a buffer in accordance with an embodiment of the present invention.

Referring now to FIG. 4, shown is a block diagram detailing operations performed in sampling, generating and programming one or more controllable elements of a buffer in accordance with an embodiment of the present invention. As shown in FIG. 4, method 300 may be performed by logic associated with an I/O buffer, such as a logic unit of an I/O controller of a processor or SoC.

As shown in FIG. 4, method 300 begins by sampling and determining one or more control values based on the sampling (block 310). More specifically, various steps may be performed to prepare for and sample the value present on the pad and then to determine a control value based on this sampled value. In an embodiment, first the pad may be tri-stated to ensure that the processor is not driving any state onto the pad (block 312). In an embodiment, this tri-state may be realized by checking to ensure the TX enable control pin of the I/O buffer is deasserted. Next at block 314 the state of the pad may be sampled. In an embodiment, sampling may be performed using a receiver path of the I/O buffer to obtain the value. This value may be stored in a register, as a RX input value to determine the pad state. This value can then be registered for reference later.

Various control values may be determined based on the state of the pad. In the example shown, when the sampling indicates a low value, a pulldown controllable element may be enabled (block 316). Instead if a high value is indicated, a pullup controllable element may be enabled (block 318). And, if the pad is unused in a given system configuration (meaning that there is no active connection to the pad in a given platform), a default standby state is enabled (block 319). In an embodiment, the standby state may be implemented by enabling the pulldown controllable element and enabling a receiver of the I/O buffer for wake support. In this way the lowest possible leakage configuration for the pad is realized.

Next based on the determined control values, possible pad value states may be generated (block 320). Based on the determined control values, a pad value policy may be set at block 322. In an embodiment, a 2 bit field may be provided per pad to indicate both direction and value. In such embodiment, a most significant bit denotes whether the pad is controlled to be an input or output pad, and the least significant bit indicates whether the value on the pad is to be of high or low value. Table 1 below shows example values for an I/O pad value policy in accordance with an embodiment.

TABLE 1

| 00 | Output, High |
|----|--------------|
| 01 | Output, Low  |
| 10 | Input, High  |
| 11 | Input, Low   |

Next at block 324 it is determined whether an override or backup option is enabled. Such override or backup option may be controllable by software or firmware that executes to indicate an override is desired. In addition to providing an active override indicator, default control values may be obtained, e.g., from an appropriate storage. Then at block 326 final pad configuration values may be mapped for one or more buffer control registers. In different embodiments, varying amounts of control registers may be present. In some cases, a single control register is present that includes fields for each controllable element of the buffer, while in other implementations, multiple configuration registers may be provided, each including at least one field associated with a given controllable element.

Still referring to FIG. 4, next at block 330 a pad control register can be programmed using the final pad configuration values. In the example of FIG. 4, assume the presence of a single pad control register including a plurality of fields, namely a transmit enable field 332, a receive enable field 334, a pulldown enable field 336, and a pullup enable field 338. In an embodiment, these fields store control values to control the signals provided to the I/O buffer of FIG. 1. Thus based on the finally mapped configuration values, these fields of the pad control register are programmed.

As a result, these values may be sent to control the corresponding controllable elements of the buffer to enable the buffer to be in the desired state. For example, in the case of a standby mode or another low power mode, the I/O buffer can be configured to present the same value on the pad as that sampled, assuming an override or backup mode is not selected. Although shown at this high level in the embodiment of FIG. 4, understand the scope of the present invention is not limited in this regard.

Embodiments eliminate human-introduced errors in programming I/O configuration registers, helping to reduce time to market for the SoC. In addition, I/O buffer pad programming is tuned to match the GPIO circuit buffer design and constrain possible state values available. By providing power management logic in an I/O controller as described herein, a power drain due to I/O pad contention can be avoided.

Figure 5:
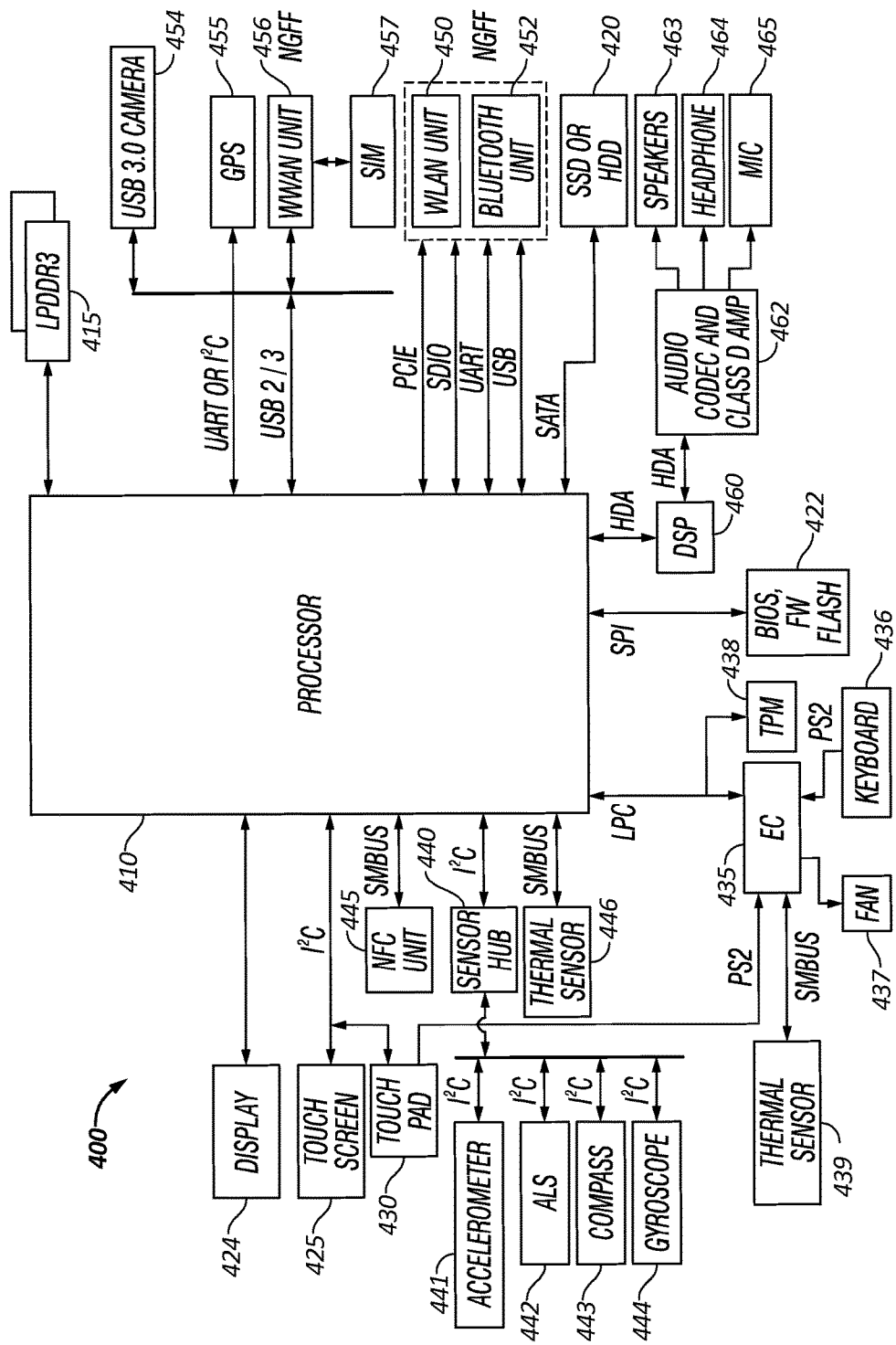

Referring now to FIG. 5, a block diagram of components present in a computer system in accordance with an embodiment of the present invention. As shown in FIG. 5, system 400 may include any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 5 is intended to show a high level view of many components of the computer system. However, it is to be understood that some of the components shown may be omitted, additional components may be present, and different arrangement of the components shown may occur in other implementations.

As seen in FIG. 5, a processor 410, in one embodiment, includes a microprocessor, multi-core processor, multi-threaded processor, an ultra low voltage processor, an embedded processor, or other known processing element. In the illustrated implementation, processor 410 acts as a main processing unit and central hub for communication with many of the various components of the system 400. As one example, processor 400 is implemented as a system on a chip (SoC). As a specific illustrative example, processor 410 may be an Intel® Architecture Core™-based processor such as an i3, i5, i7 or another such processor available from Intel Corporation, Santa Clara, Calif. However, other low power processors such as available from Advanced Micro Devices, Inc. (AMD) of Sunnyvale, Calif., an ARM-based design from ARM Holdings, Ltd. or customer thereof or a MIPS-based design from MIPS Technologies, Inc. of Sunnyvale, Calif., or their licensees or adopters may instead be present in other embodiments such as an Apple A5 processor, a Qualcomm Snapdragon processor, or TI OMAP processor. Certain details regarding the architecture and operation of processor 410 in one implementation will be discussed further below.

Processor 410, in one embodiment, communicates with a system memory 415. As an illustrative example, the system memory 415 is implemented via multiple memory devices or modules to provide for a given amount of system memory. In one embodiment, the memory is operable in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. As examples, 2/4/8/12/16 gigabytes (GB) of system memory may be present and can be coupled to processor 410 via one or more memory interconnects. In various implementations the individual memory devices may be of different package types such as single die package (SDP), dual die package (DDP) or quad die package (QDP). These devices, in some embodiments, are directly soldered onto a motherboard to provide a lower profile solution, while in other embodiments the devices are configured as one or more memory modules that in turn couple to the motherboard by a given connector.

To provide for persistent storage of information such as data, applications, one or more operating systems and so forth, a mass storage 420 may also couple to processor 410. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 5, a flash device 422 may be coupled to processor 410, e.g., via a serial peripheral interface (SPI). This flash device may provide for non-volatile storage of system software, including a basic input/output software (BIOS) as well as other firmware of the system.

Various input/output (I/O) devices may be present within system 400. In various embodiments, at least some of the devices may be coupled to processor 410 via I/O buffers controlled as described herein. Specifically shown in the embodiment of FIG. 5 is a display 424 which may be a high definition LCD or LED panel configured within a lid portion of the chassis. This display panel may also provide for a touch screen 425, e.g., adapted externally over the display panel such that via a user's interaction with this touch screen, user inputs can be provided to the system to enable desired operations, e.g., with regard to the display of information, accessing of information and so forth. In one embodiment, display 424 may be coupled to processor 410 via a display interconnect that can be implemented as a high performance graphics interconnect. Touch screen 425 may be coupled to processor 410 via another interconnect, which in an embodiment can be an I$^2$C interconnect. As further shown in FIG. 5, in addition to touch screen 425, user input by way of touch can also occur via a touch pad 430 which may be configured within the chassis and may also be coupled to the same I$^2$C interconnect as touch screen 425.

For perceptual computing and other purposes, various sensors may be present within the system and may be coupled to processor 410 in different manners. Certain inertial and environmental sensors may couple to processor 410 through a sensor hub 440, e.g., via an I$^2$C interconnect. In the embodiment shown in FIG. 5, these sensors may include an accelerometer 441, an ambient light sensor (ALS)

442, a compass 443 and a gyroscope 444. Other environmental sensors may include one or more thermal sensors 446 which in some embodiments couple to processor 410 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

Also seen in FIG. 5, various peripheral devices may couple to processor 410 via a low pin count (LPC) interconnect. In the embodiment shown, various components can be coupled through an embedded controller 435. Such components can include a keyboard 436 (e.g., coupled via a PS2 interface), a fan 437, and a thermal sensor 439. In some embodiments, touch pad 430 may also couple to EC 435 via a PS2 interface. In addition, a security processor such as a trusted platform module (TPM) 438 in accordance with the Trusted Computing Group (TCG) TPM Specification Version 1.2, dated Oct. 2, 2003, may also couple to processor 410 via this LPC interconnect. However, the scope of the present invention is not limited in this regard and secure processing and storage of secure information may be in another protected location such as a static random access memory (SRAM) in a security coprocessor, or as encrypted data blobs that are only decrypted when protected by a secure enclave (SE) processor mode.

System 400 can communicate with external devices in a variety of manners, including wirelessly. In the embodiment shown in FIG. 5, various wireless modules, each of which can correspond to a radio configured for a particular wireless communication protocol, are present. One manner for wireless communication in a short range such as a near field may be via a near field communication (NFC) unit 445 which may communicate, in one embodiment with processor 410 via an SMBus. Note that via this NFC unit 445, devices in close proximity to each other can communicate. For example, a user can enable system 400 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 5, additional wireless units can include other short range wireless engines including a WLAN unit 450 and a Bluetooth unit 452. Using WLAN unit 450, Wi-Fi™ communications in accordance with a given Institute of Electrical and Electronics Engineers (IEEE) 802.11 standard can be realized, while via Bluetooth unit 452, short range communications via a Bluetooth protocol can occur. These units may communicate with processor 410 via, e.g., a USB link or a universal asynchronous receiver transmitter (UART) link. Or these units may couple to processor 410 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 456 which in turn may couple to a subscriber identity module (SIM) 457. In addition, to enable receipt and use of location information, a GPS module 455 may also be present. Note that in the embodiment shown in FIG. 5, WWAN unit 456 and an integrated capture device such as a camera module 454 may communicate via a given USB protocol such as a USB 2.0 or 3.0 link, or a UART or I²C protocol. Again the actual physical connection of these units can be via adaptation of a NGFF add-in card to an NGFF connector configured on the motherboard.

An integrated camera module 454 can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 460, which may couple to processor 410 via a high definition audio (HDA) link. Similarly, DSP 460 may communicate with an integrated coder/decoder (CODEC) and amplifier 462 that in turn may couple to output speakers 463 which may be implemented within the chassis. Similarly, amplifier and CODEC 462 can be coupled to receive audio inputs from a microphone 465 which in an embodiment can be implemented via dual array microphones (such as a digital microphone array) to provide for high quality audio inputs to enable voice-activated control of various operations within the system. Note also that audio outputs can be provided from amplifier/CODEC 462 to a headphone jack 464. Although shown with these particular components in the embodiment of FIG. 5, understand the scope of the present invention is not limited in this regard.

In some embodiments, processor 410 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

Figure 6:
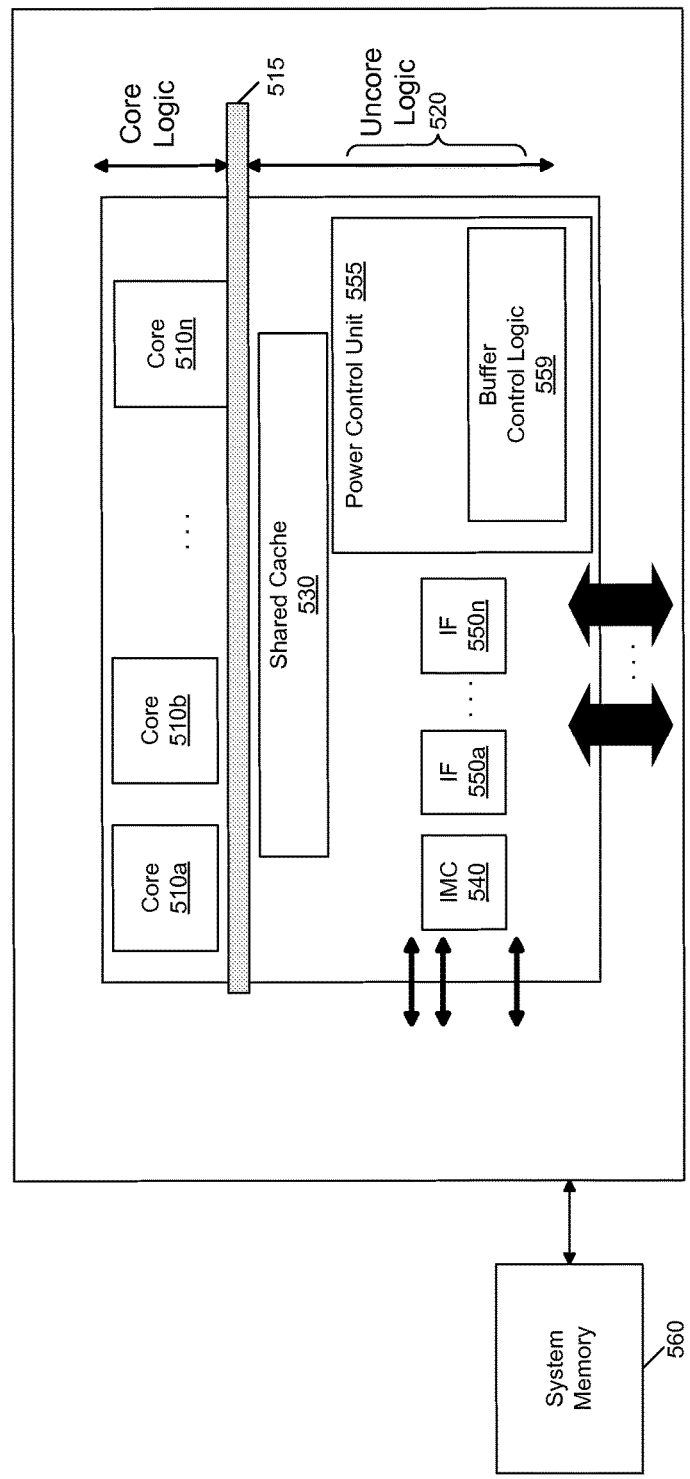
FIG. 6 is a block diagram of a processor in accordance with an embodiment of the present invention.

Embodiments can be implemented in processors for various markets including server processors, desktop processors, mobile processors and so forth. Referring now to FIG. 6, shown is a block diagram of a processor in accordance with an embodiment of the present invention. As shown in FIG. 6, processor 500 may be a multicore processor including a plurality of cores $510_a$-$510_n$. In one embodiment, each such core may be of an independent power domain and can be configured to enter and exit various architectural states, such as active states and/or maximum performance states based on workload. The various cores may be coupled via an interconnect 515 to a system agent or uncore 520 that includes various components. As seen, the uncore 520 may include a shared cache 530 which may be a last level cache. In addition, the uncore may include an integrated memory controller 540, various interfaces 550 and a power control unit 555. In various embodiments, power control unit 555 may include a buffer control logic 559 in accordance with an embodiment of the present invention. Using this logic, various pads of the processor such as coupled to different interfaces can be controlled to be in a state to avoid electrical contention. Understand that in other embodiments, this control logic may be implemented within an I/O controller of the interfaces.

With further reference to FIG. 6, processor 500 may communicate with a system memory 560, e.g., via a memory bus. In addition, by interfaces 550, connection can be made to various off-chip components such as peripheral devices, mass storage and so forth. Such interfaces may include GPIO buffers controlled as described herein. While shown with this particular implementation in the embodiment of FIG. 6, the scope of the present invention is not limited in this regard.

Figure 7:
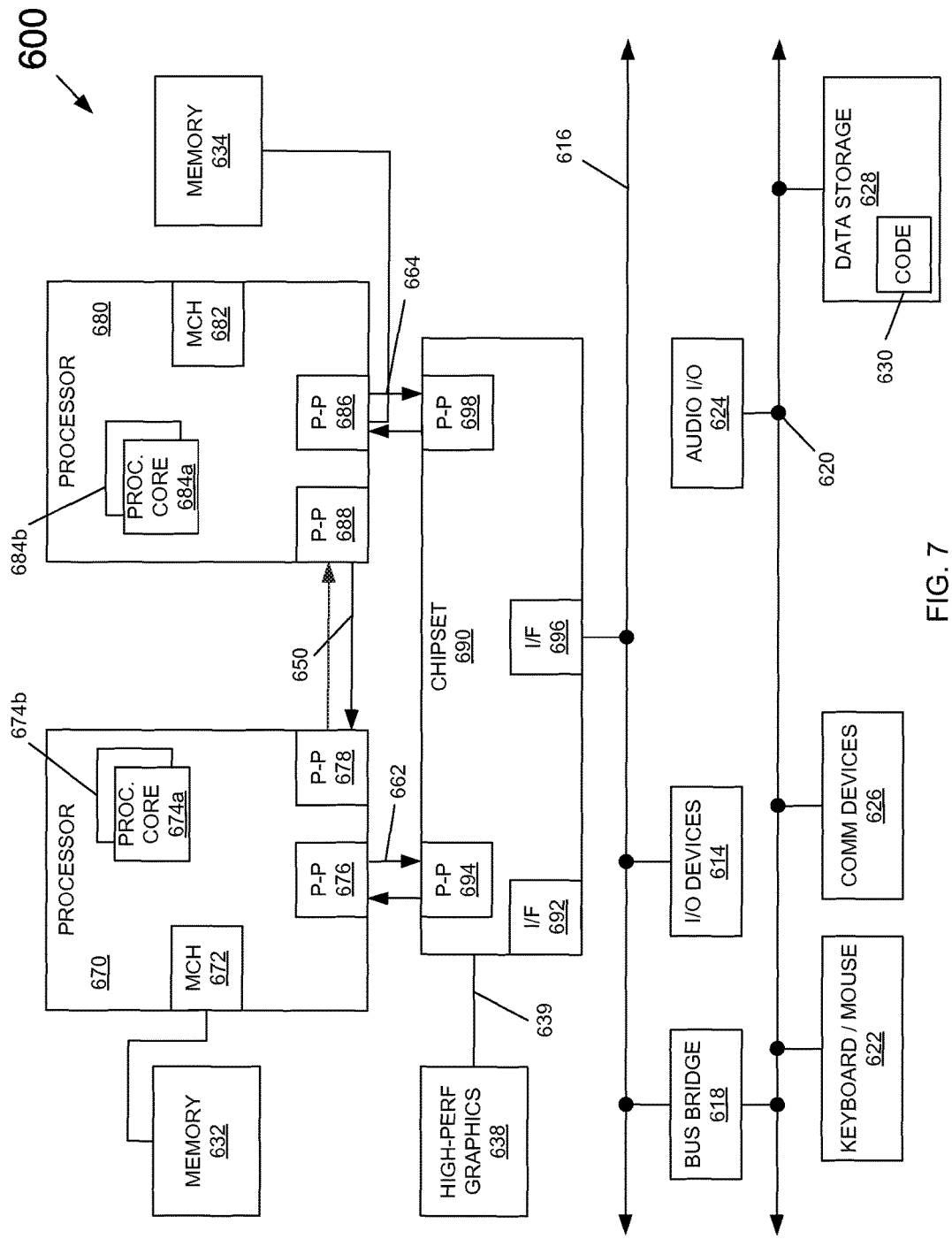
FIG. 7 is a block diagram of a system in accordance with an embodiment of the present invention.

Embodiments may be implemented in many different system types. Referring now to FIG. 7, shown is a block diagram of a system in accordance with an embodiment of the present invention. As shown in FIG. 7, multiprocessor system 600 is a point-to-point interconnect system, and includes a first processor 670 and a second processor 680 coupled via a point-to-point interconnect 650. As shown in FIG. 7, each of processors 670 and 680 may be multicore processors, including first and second processor cores (i.e., processor cores 674a and 674b and processor cores 684a and 684b), although potentially many more cores may be present in the processors. Each of the processors can include a PCU or other logic to autonomously control pin states to avoid electrical contention during standby or other architectural states, as described herein.

Still referring to FIG. 7, first processor 670 further includes a memory controller hub (MCH) 672 and point-to-point (P-P) interfaces 676 and 678. Similarly, second processor 680 includes a MCH 682 and P-P interfaces 686 and 688. As shown in FIG. 7, MCH's 672 and 682 couple the processors to respective memories, namely a memory 632 and a memory 634, which may be portions of system memory (e.g., DRAM) locally attached to the respective processors. First processor 670 and second processor 680 may be coupled to a chipset 690 via P-P interconnects 662 and 664, respectively. As shown in FIG. 7, chipset 690 includes P-P interfaces 694 and 698.

Furthermore, chipset 690 includes an interface 692 to couple chipset 690 with a high performance graphics engine 638, by a P-P interconnect 639. In turn, chipset 690 may be coupled to a first bus 616 via an interface 696. As shown in FIG. 7, various input/output (I/O) devices 614 may be coupled to first bus 616, along with a bus bridge 618 which couples first bus 616 to a second bus 620. Various devices may be coupled to second bus 620 including, for example, a keyboard/mouse 622, communication devices 626 and a data storage unit 628 such as a disk drive or other mass storage device which may include code 630, in one embodiment. Further, an audio I/O 624 may be coupled to second bus 620. Embodiments can be incorporated into other types of systems including mobile devices such as a smart cellular telephone, tablet computer, netbook, Ultrabook™, or so forth.

Figure 8:
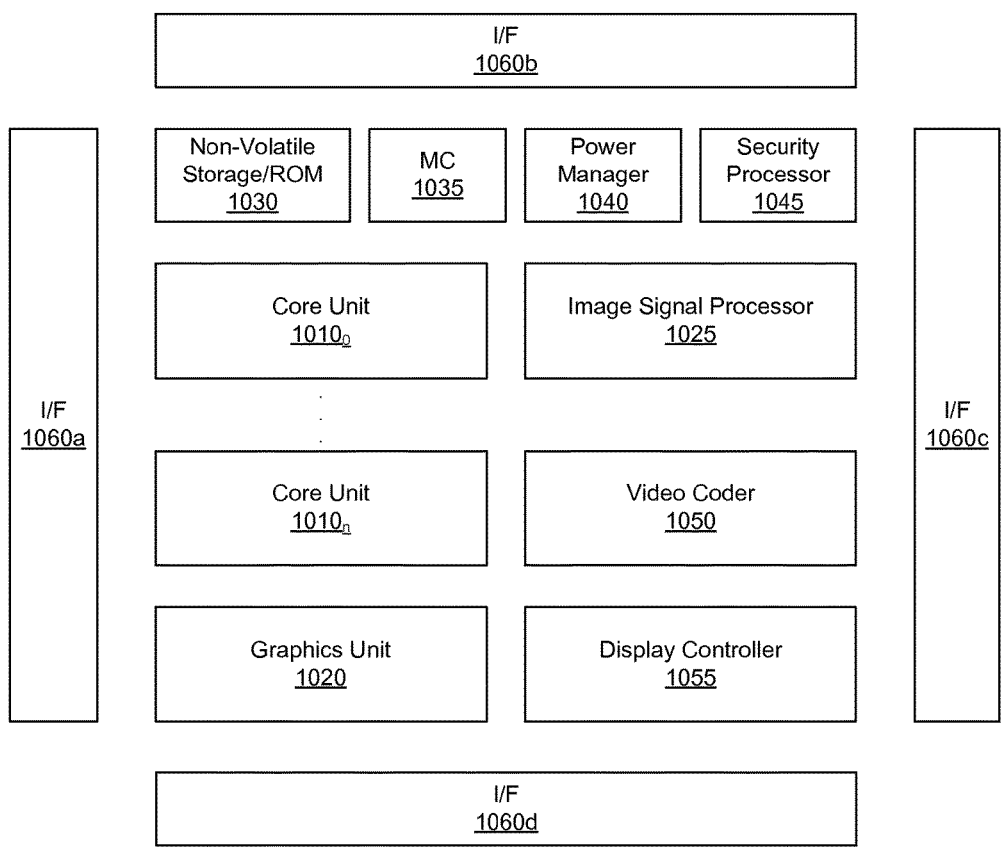
FIG. 8 is a block diagram of a processor in accordance with another embodiment of the present invention.

Referring now to FIG. 8, shown is a block diagram of a processor in accordance with another embodiment of the present invention. In the embodiment of FIG. 8, processor 1000 may be a system on a chip (SoC) including multiple domains, each of which may be controlled to operate at an independent operating voltage and operating frequency. As a specific illustrative example, processor 1000 may be an Intel® Architecture Core™-based processor such as an i3, i5, i7 or another such processor available from Intel Corporation, Santa Clara, Calif. However, other low power processors such as available from Advanced Micro Devices, Inc. (AMD) of Sunnyvale, Calif., an ARM-based design from ARM Holdings, Ltd. or customer thereof or a MIPS-based design from MIPS Technologies, Inc. of Sunnyvale, Calif., or their licensees or adopters may instead be present in other embodiments such as an Apple A5 processor, a Qualcomm Snapdragon processor, or Texas Instruments OMAP processor. Such SoC may be used in a low power system such as a smartphone, tablet computer, Ultrabook™ computer or other portable computing device.

In the high level view shown in FIG. 8, processor 1000 includes a plurality of core units $1010_0$-$1010_n$. Each core unit may include one or more processor cores, one or more cache memories and other circuitry. Each core unit 1010 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.) or other instruction set or combinations thereof. Note that some of the core units may be heterogeneous resources (e.g., of a different design). In addition, each such core may be coupled to a cache memory which in an embodiment may be a shared level (L2) cache memory. A non-volatile storage 1030 may be used to store various programs and other data. For example, this storage may be used to store at least portions of microcode, boot information such as a BIOS, other system software or so forth.

Each core unit 1010 may also include an interface such as a bus interface unit to enable interconnection to additional circuitry of the processor. In an embodiment, each core unit 1010 couples to a coherent fabric that may act as a primary cache coherent on-die interconnect that in turn couples to a memory controller 1035. In turn, memory controller 1035 controls communications with a memory such as a dynamic random access memory (DRAM) (not shown for ease of illustration in FIG. 8).

In addition to core units, additional processing engines are present within the processor, including at least one graphics unit 1020 which may include one or more graphics processing units (GPUs) to perform graphics processing as well as to possibly execute general purpose operations on the graphics processor (so-called GPGPU operation). In addition, at least one image signal processor 1025 may be present. Signal processor 1025 may be configured to process incoming image data received from one or more capture devices, either internal to the SoC or off-chip. Other accelerators also may be present. In the illustration of FIG. 8, a video coder 1050 may perform coding operations including encoding and decoding for video information, e.g., providing hardware acceleration support for high definition video content. A display controller 1055 further may be provided to accelerate display operations including providing support for internal and external displays of a system. In addition, a security processor 1045 may be present to perform security operations such as secure boot operations, various cryptography operations and so forth. Each of the units may have its power consumption controlled via a power manager 1040. In some embodiments, SoC 1000 may further include a non-coherent fabric coupled to the coherent fabric to which various peripheral devices may couple. One or more interfaces 1060a-1060d enable communication with one or more off-chip devices. One or more of the interfaces may include control logic as described herein to autonomously maintain a desired value on a pad coupled to an I/O buffer when in a given architectural state. Such communications may be according to a variety of communication protocols such as PCIe™, GPIO, USB, I2C, UART, MIPI, SDIO, DDR, SPI, HDMI, among other types of communication protocols. Although shown at this high level in the embodiment of FIG. 8, understand the scope of the present invention is not limited in this regard.

The following examples pertain to further embodiments.

In one example, an apparatus comprises: an I/O buffer to couple a logic unit of the apparatus to a device coupled to the apparatus via a pad; and a logic coupled to the I/O buffer to detect a value on the pad and to control the I/O buffer to provide the value to the pad, responsive to entry into an architectural state of the apparatus.

In an example, a configuration storage is coupled to the I/O buffer, and the logic is to program at least one field of the configuration storage based at least in part on the detected value. The at least one field may comprise a first field to store a control value for a first switch coupled between a supply voltage node and an output node of the I/O buffer, and when closed the first switch is to enable a pullup impedance to couple to the output node. The at least one field may further comprise a second field to store a second control value for a second switch coupled between a reference voltage node and the output node of the I/O buffer, where when closed the second switch is to enable a pulldown impedance to couple to the output node. The at least one field may also comprise a third field to store an enable signal to enable a transmitter of the I/O buffer.

In an example, the logic is to control the I/O buffer to provide an override value to the pad when an override indicator is active, where a software driver is to provide the override value.

In an example, the architectural state comprises an entry into a low power state.

In an example, the I/O buffer comprises: a transmitter to receive a signal and to output the signal to the pad; a pullup resistance configured to be controllably coupled between a supply voltage node and an output node of the transmitter; and a pulldown resistance configured to be controllably coupled between a reference voltage node and the output node of the transmitter. The I/O buffer may further comprise a receiver to receive a second signal from the pad and to output the signal to the logic unit.

Note that the above apparatus may comprise a processor to be implemented using various means.

In an example, the processor comprises a system on a chip (SoC) incorporated in a user equipment touch-enabled device.

In another example, a system comprises a display and a memory, and includes the processor of one or more of the above examples.

In another example, a system comprises: a processor formed in an IC, where the processor includes: at least one core; an I/O controller having a power management logic; and at least one I/O buffer coupled to the I/O controller to communicate signal information with one or more devices coupled to the processor, where the power management logic is to receive an indication of entry into a low power state of at least a portion of the processor, sample a value on a pad of the IC, the pad coupled between the at least one I/O buffer and an interconnect, determine a state of the value, and dynamically control the at least one I/O buffer, responsive to the state of the value. The system may further include a DRAM coupled to the processor.

In an example, the power management logic is to set a field of a control storage responsive to the sampled value, to cause coupling of at least one of a first impedance and a second impedance to an output node of the at least one I/O buffer. The power management logic may further sample the value, determine the state, and cause the coupling in a first mode, and in a second mode to cause the coupling based on an override value provided by a firmware or a software driver. The power management logic may cause coupling of the first impedance or the second impedance to enable the I/O buffer to output a signal corresponding to the sampled value.

In another example, a method comprises: sampling a state on a pad of an IC coupled to an interconnect, the pad coupled to a buffer of the IC, the buffer including a transmitter and a receiver; selecting a control value for at least one controllable element of the buffer based on the sampled state; and determining whether an override indicator is active, and if so storing an override value in a storage associated with the buffer, and otherwise storing the control value in the storage.

In an example, the method further comprises controlling the buffer to maintain the sampled state using the stored control value.

In an example, the method further comprises receiving the override indicator from a firmware of the system.

In an example, the method further comprises controlling the buffer to place the pad into a tri-state before sampling the state.

In an example, the method further comprises storing the sampled state in a second storage, and thereafter referencing the sampled state.

In an example, the method further comprises controlling the buffer to couple a pulldown impedance to the pad when the pad is unused in a platform including the IC.

In another example, a computer readable medium including instructions is to perform the method of any of the above examples.

In another example, an apparatus comprises means for performing the method of any one of the above examples.

Understand that various combinations of the above examples are possible.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an input/output (I/O) buffer coupled to a logic circuit of the apparatus;
   a pad to couple an external device to the I/O buffer of the apparatus; and
   a control logic circuit coupled to the I/O buffer to:
   sample a state on the pad subsequent to a first entry into low power state of the apparatus;
   determine a first control value for the I/O buffer based on the sampled state and the low power state of the apparatus;
   store the first control value in a configuration storage associated with the I/O buffer;
   in response to a second entry into the low power state of the apparatus, control the I/O buffer to maintain the sampled state at the pad using the stored first control value.

2. The apparatus of claim 1, wherein the control logic circuit is to store the first control value and control the I/O buffer to maintain the sampled state in response to a determination that an override indicator is not active, and wherein the control logic circuit is to:
   in response to a determination that the override indicator is active:
   store a second control value in the configuration storage; and
   control the I/O buffer to maintain an override value at the pad using the stored second control value, wherein the override value is a default value provided by a software driver.

3. The apparatus of claim 1, wherein the configuration storage comprises a first field to store a first setting for a first switch coupled between a supply voltage node and an output node of the I/O buffer, wherein when closed the first switch is to enable a pullup impedance to couple to the output node.

4. The apparatus of claim 3, wherein the configuration storage comprises a second field to store a second setting for a second switch coupled between a reference voltage node and the output node of the I/O buffer, wherein when closed the second switch is to enable a pulldown impedance to couple to the output node.

5. The apparatus of claim 4, wherein the configuration storage comprises a third field to store a third setting to enable a transmitter of the I/O buffer.

6. The apparatus of claim 1, the control logic circuit to place the pad into a tri-state before sampling the state of the pad.

7. The apparatus of claim 1, wherein the I/O buffer comprises:
   a transmitter to receive a signal and to output the signal to the pad;
   a pullup resistance configured to be controllably coupled between a supply voltage node and an output node of the transmitter; and
   a pulldown resistance configured to be controllably coupled between a reference voltage node and the output node of the transmitter.

8. The apparatus of claim 7, wherein the I/O buffer further comprises a receiver to receive a second signal from the pad and to output the signal to the logic unit.

9. A system comprising:
   a processor formed in an integrated circuit (IC), the processor including:
   at least one core;
   an input/output (I/O) controller having a power management logic circuit; and
   at least one input/output (I/O) buffer coupled to the I/O controller to communicate signal information with one or more devices coupled to the processor,
   wherein the power management logic circuit is to:
   receive an indication of a first entry into a low power state of at least a portion of the processor,
   responsive the first entry, sample a state on a pad of the IC, the pad coupled between the at least one I/O buffer and an interconnect,
   determine a first control value for the at least one I/O buffer based on the sampled state and the low power state,
   store the first control value in a configuration storage associated with the I/O buffer,
   in response to a second entry into the low power state, control the I/O buffer to maintain the sampled state at the pad using the stored first control value; and
   a dynamic random access memory (DRAM) coupled to the processor.

10. The system of claim 9, wherein the power management logic circuit is to set a field of the configuration storage responsive to the sampled value, to cause coupling of at least one of a first impedance and a second impedance to an output node of the at least one I/O buffer.

11. The system of claim 10, wherein the power management logic circuit is to:
    sample the value, determine the first control value, and cause the coupling in response to a determination that an override indicator is not active; and
    in response to a determination that the override indicator is active, cause the coupling based on an override value, wherein the override value is provided by a firmware or a software driver.

12. The system of claim 11, wherein the power management logic circuit is to cause coupling of the first impedance or the second impedance to enable the I/O buffer to output a signal corresponding to the sampled value.

13. A method comprising:
    responsive to a first entry into a low power state, sampling a state on a pad of an integrated circuit (IC) coupled to an interconnect, the pad coupled to a buffer of the IC, the buffer including a transmitter and a receiver;
    selecting a first control value for at least one controllable element of the buffer based on the sampled state and the low power state;
    storing the selected first control value in a storage associated with the buffer; and in response to a second entry into the low power state, controlling the buffer to maintain the sampled state at the pad using the stored first control value.

14. The method of claim 13, further comprising:
determining whether an override indicator is active;
in response to a determination that the override indicator is active:
  store a second control value in the configuration storage; and
  control the I/O buffer to maintain an override value at the pad using the second control value,
wherein storing the first control value and controlling the buffer to maintain the sampled state are performed in response to a determination that an override indicator is not active.

15. The method of claim 14, further comprising receiving the override indicator from a firmware of the system.

16. The method of claim 13, further comprising controlling the buffer to place the pad into a tri-state before sampling the state.

17. The method of claim 13, wherein the storage comprises a plurality of fields including:
  a first field to store a first setting for a first switch coupled between a supply voltage node and an output node of the buffer;
  a second field to store a second setting for a second switch coupled between a reference voltage node and the output node of the buffer;
  a third field to store a third setting for a transmitter of the buffer; and
  a fourth field to store a fourth setting for a receiver of the buffer.

18. The method of claim 13, further comprising storing the sampled state in a second storage, and thereafter referencing the sampled state.

19. The method of claim 13, further comprising controlling the buffer to couple a pulldown impedance to the pad when the pad is unused in a platform including the IC.

* * * * *